United States Patent
Baba

(10) Patent No.: US 10,342,125 B2
(45) Date of Patent: Jul. 2, 2019

(54) MULTILAYER SUBSTRATE

(71) Applicant: Murata Manufacturing Co., Ltd., Nagaokakyo-shi, Kyoto-fu (JP)

(72) Inventor: Takahiro Baba, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/239,562

(22) Filed: Jan. 4, 2019

(65) Prior Publication Data

US 2019/0141831 A1    May 9, 2019

Related U.S. Application Data

(63) Continuation of application No. PCT/JP2017/026760, filed on Jul. 25, 2017.

(30) Foreign Application Priority Data

Aug. 2, 2016 (JP) ................................. 2016-151892
Apr. 7, 2017 (JP) ................................. 2017-076688

(51) Int. Cl.
| H05K 1/05 | (2006.01) |
| H05K 1/02 | (2006.01) |
| H05K 3/46 | (2006.01) |
| H05K 1/16 | (2006.01) |
| H01F 17/00 | (2006.01) |
| H05K 3/00 | (2006.01) |

(52) U.S. Cl.
CPC ....... H05K 1/0298 (2013.01); H01F 17/0013 (2013.01); H05K 1/16 (2013.01); H05K 3/0058 (2013.01); H05K 3/46 (2013.01)

(58) Field of Classification Search
CPC ...... H05K 1/0298; H05K 1/16; H05K 3/0058; H05K 3/46; H01F 17/0013

USPC ......................................................... 174/252
See application file for complete search history.

(56) References Cited

U.S. PATENT DOCUMENTS

| 2008/0266019 A1 | 10/2008 | Fusayasu et al. |
| 2010/0206625 A1 | 8/2010 | Maetani |
| 2017/0187087 A1 | 6/2017 | Baba et al. |

FOREIGN PATENT DOCUMENTS

| JP | 03-044307 U | 4/1991 |
| JP | 2000-101211 A | 4/2000 |
| JP | 2009-010328 A | 1/2009 |

(Continued)

OTHER PUBLICATIONS

Official Communication issued in International Patent Application No. PCT/JP2017/026760, dated Oct. 17, 2017.

*Primary Examiner* — Tremesha S Willis
(74) *Attorney, Agent, or Firm* — Keating & Bennett, LLP

(57) ABSTRACT

A multilayer substrate includes a laminate, signal conductors, and external connection conductors. The signal conductors are at different positions in a lamination direction of the laminate. The external connection conductors are provided on a back surface of the laminate. A first signal conductor is connected at one end to one of the external connection conductors by a first wiring conductor. A second signal conductor is connected at one end to one of the external connection conductors by a second wiring conductor. The first signal conductor is closer to the back surface than the second signal conductor. The first wiring conductor includes wiring adjusting conductors each having a length corresponding to a distance difference in the lamination direction between the first and second signal conductors.

21 Claims, 11 Drawing Sheets

(56) References Cited

FOREIGN PATENT DOCUMENTS

| WO | 2009/119849 | A1 | 10/2009 |
|----|-------------|----|---------|
| WO | 2016/047540 | A1 | 3/2016  |

MULTILAYER SUBSTRATE

CROSS REFERENCE TO RELATED APPLICATIONS

This application claims the benefit of priority to Japanese Patent Application No. 2016-151892 filed on Aug. 2, 2016 and Japanese Patent Application No. 2017-076688 filed on Apr. 7, 2017, and is a Continuation Application of PCT Application No. PCT/JP2017/026760 filed on Jul. 25, 2017. The entire contents of each application are hereby incorporated herein by reference.

BACKGROUND OF THE INVENTION

1. Field of the Invention

The present invention relates to a multilayer substrate including a laminate provided by laminating a plurality of insulating base materials, and a plurality of signal conductors disposed in the laminate.

2. Description of the Related Art

Japanese Unexamined Utility Model Publication No. H3-044307 discloses a transmission line including a plurality of signal conductors. The transmission line disclosed in Japanese Unexamined Utility Model Publication No. H3-044307 includes a laminate provided by laminating a plurality of dielectrics. The plurality of signal conductors is disposed at respective positions different in a lamination direction.

This kind of conventional transmission line requires wiring portions for connecting respective end portions of each of the signal conductors to respective external connection conductors provided on the front surface or the back surface of the laminate. Thus, the conventional transmission line uses an interlayer-connection conductor extending in the lamination direction as each of the wiring portions.

Unfortunately, the conventional transmission line is configured such that the plurality of signal conductors is different in position in the lamination direction. This causes the interlayer-connection conductor connected to each of the signal conductor to be different in length, so that impedance of each of the wiring portions is different for each of the signal conductors.

As a result, the wiring portions connecting the corresponding plurality of signal conductors and the corresponding external connection conductors are different in impedance. For example, when the wiring conductor connected to one signal conductor is provided to have an impedance of 50Ω, the wiring conductor connected to the other signal conductor has an impedance deviating from 50Ω. Thus, a transmission line portion different in impedance causes loss.

SUMMARY OF THE INVENTION

Preferred embodiments of the present invention provide multilayer substrates provided with a plurality of transmission lines including a plurality of signal conductors, each of the transmission lines including a wiring portion with the same impedance.

A multilayer substrate according to a preferred embodiment of the present invention includes a laminate, a first signal conductor, a second signal conductor, a first external connection conductor, a second external connection conductor, a first wiring conductor, and a second wiring conductor. The laminate is provided by laminating a plurality of dielectric layers. The first signal conductor and the second signal conductor are disposed at respective positions different in a lamination direction of the laminate. The first external connection conductor and the second external connection conductor are provided on a first surface perpendicular or substantially perpendicular to the lamination direction of the laminate. The first wiring conductor connects an end of the first signal conductor to the first external connection conductor. The second wiring conductor connects an end of the second signal conductor to the second external connection conductor. The first signal conductor is disposed at a position closer to the first surface than the second signal conductor. The first wiring conductor includes a wiring adjusting portion having a length corresponding to a distance difference between the first signal conductor and the second signal conductor in the lamination direction.

This structure causes the wiring adjusting portion to reduce a difference in impedance due to a difference between a connection distance between the first signal conductor and the first external connection conductor, and a connection distance between the second signal conductor and the second external connection conductor.

In a multilayer substrate according to a preferred embodiment of the present invention, the wiring adjusting portion may have a shape bypassing a placement position of the second wiring conductor in a plane parallel or substantially parallel to the first surface as viewed in the lamination direction.

This structure causes only a conductor pattern in one plane to reduce a difference in impedance. This enhances connection reliability of the wiring adjusting portion.

In a multilayer substrate according to a preferred embodiment of the present invention, the wiring adjusting portion may include a portion extending from a position where the first signal conductor is disposed toward a position where the second signal conductor is disposed in the lamination direction.

This structure causes a difference in impedance to be reduced by using a conductor pattern extending in the lamination direction. This enables the wiring adjusting portion to be reduced in size in plan view.

In a multilayer substrate according to a preferred embodiment of the present invention, it is preferable that an intermediate ground conductor for a wiring conductor is provided between the first wiring conductor and the second wiring conductor.

This structure increases isolation between the first wiring conductor and the second wiring conductor.

In a multilayer substrate according to a preferred embodiment of the present invention, it is preferable to provide a planar intermediate ground conductor for a signal conductor, disposed between the first signal conductor and the second signal conductor in the lamination direction.

This structure increases isolation between the first signal conductor and the second signal conductor.

In a multilayer substrate according to a preferred embodiment of the present invention, it is preferable that the wiring adjusting portion includes a planar conductor, and the planar conductor is narrower than a line width of the first signal conductor.

This structure enables a first inductance (an inductance component of the first wiring conductor) to be increased without excessively increasing a line length of the wiring adjusting portion.

In a multilayer substrate according to a preferred embodiment of the present invention, it is preferable that the laminate includes a wiring portion, and a connection portion wider than the wiring portion, and that the wiring adjusting portion is provided in a plane parallel or substantially parallel to the first surface and is disposed in the connection portion in the laminate while having a winding shape as viewed in the lamination direction.

This structure enhances stability of the multilayer substrate disposed on a front surface of a circuit board or the like, and enables mountability of the multilayer substrate to be enhanced. This structure also enables a connector or the like to be easily mounted on the connection portion even when the multilayer substrate has an elongated shape.

This structure enables the wiring portion of the multilayer substrate to be led into a limited narrow space (a position avoiding other surface-mount components and structures), so that the multilayer substrate is capable of being disposed in a narrow space. In addition, this structure causes a wiring adjusting conductor in a winding shape to be disposed on the connection portion having a relatively large width, so that a line width of the wiring adjusting conductor is able to be increased. This enables an inductance component to be increased while reducing or preventing an increase in conductor loss of the first wiring conductor, as compared with the case where the wiring adjusting conductor is narrowed in line width.

Preferred embodiments of the present invention enable fabricating a multilayer substrate provided with a plurality of transmission lines including a plurality of signal conductors, each of the transmission lines including a wiring portion with the same impedance.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
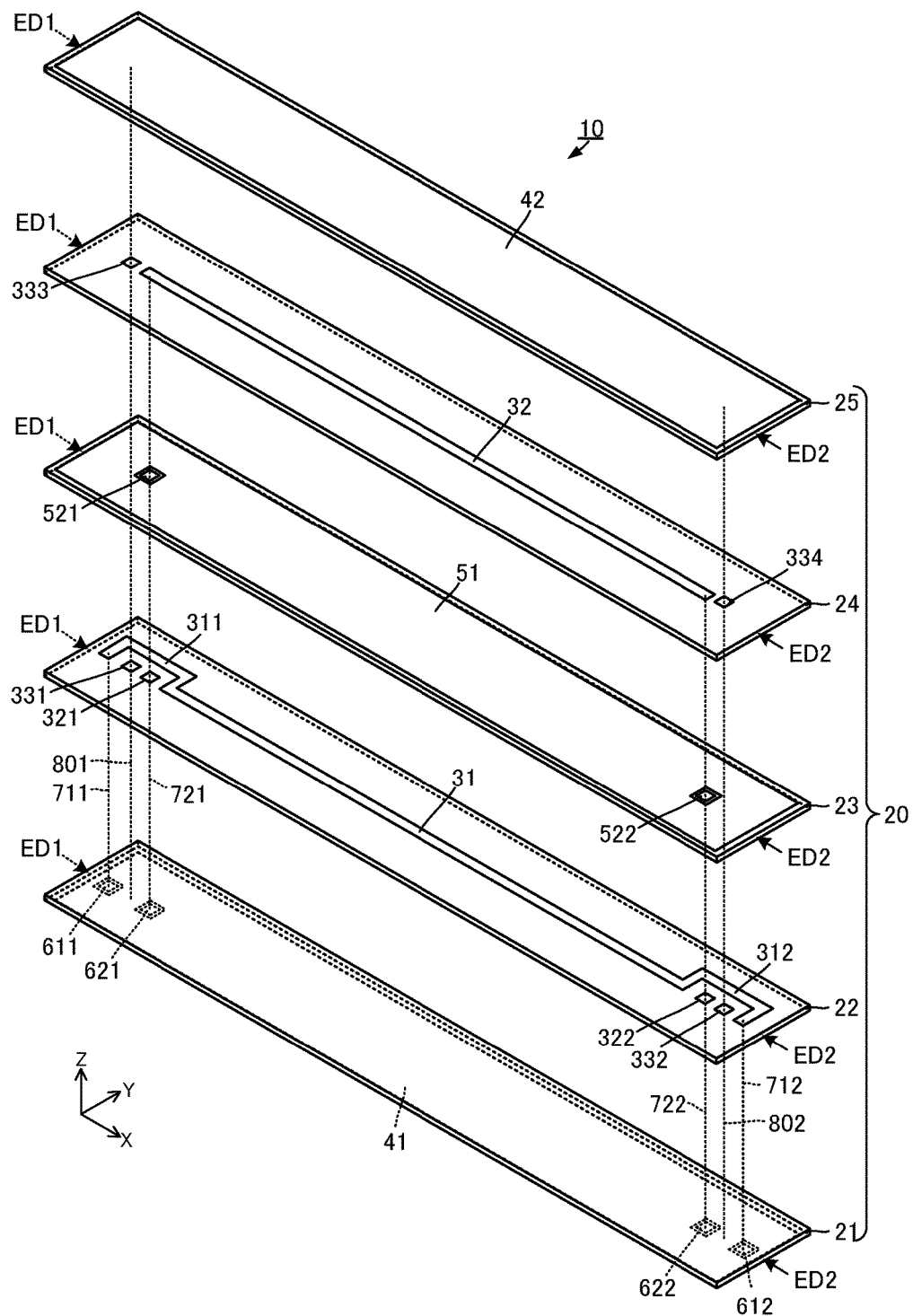
FIG. 1 is an exploded perspective view of a multilayer substrate according to a first preferred embodiment of the present invention.

Hereinafter, a plurality of aspects for practicing the present invention will be described with reference to the drawings and several specific examples. In the respective drawings, identical reference numerals identify the same elements or portions. In consideration of description of main points or easy understanding, while the preferred embodiments are separately described for convenience, structures described in different preferred embodiments can be partially substituted or combined. In the second and subsequent preferred embodiments, descriptions of matters common to those of the first preferred embodiment are eliminated, and only different points will be described. In particular, a similar operation effect caused by a similar structure will not sequentially refer to each preferred embodiment.

First Preferred Embodiment

Figure 2:
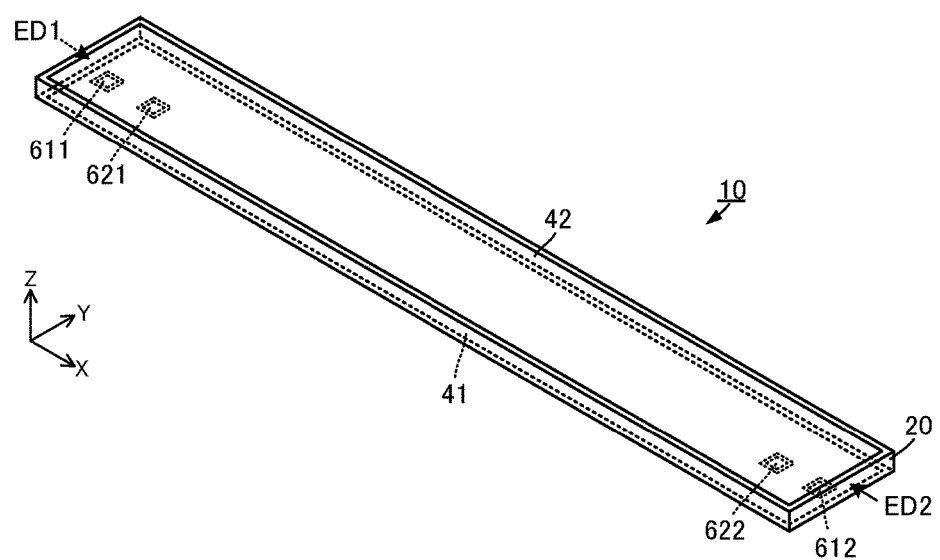
FIG. 2 is an external perspective view of the multilayer substrate according to the first preferred embodiment of the present invention.
Figure 3:
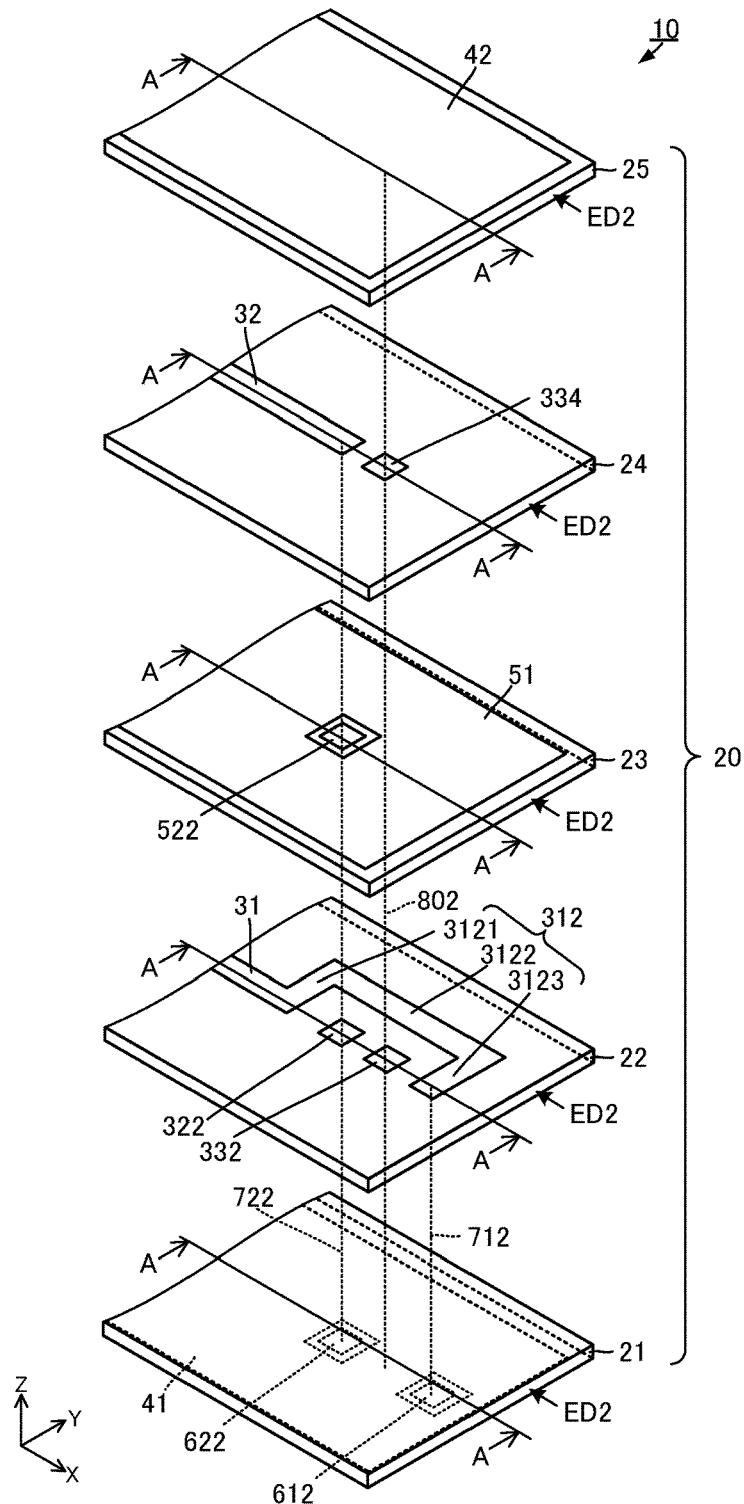
FIG. 3 is an enlarged exploded perspective view of a second end portion of the multilayer substrate according to the first preferred embodiment of the present invention.
Figure 4:
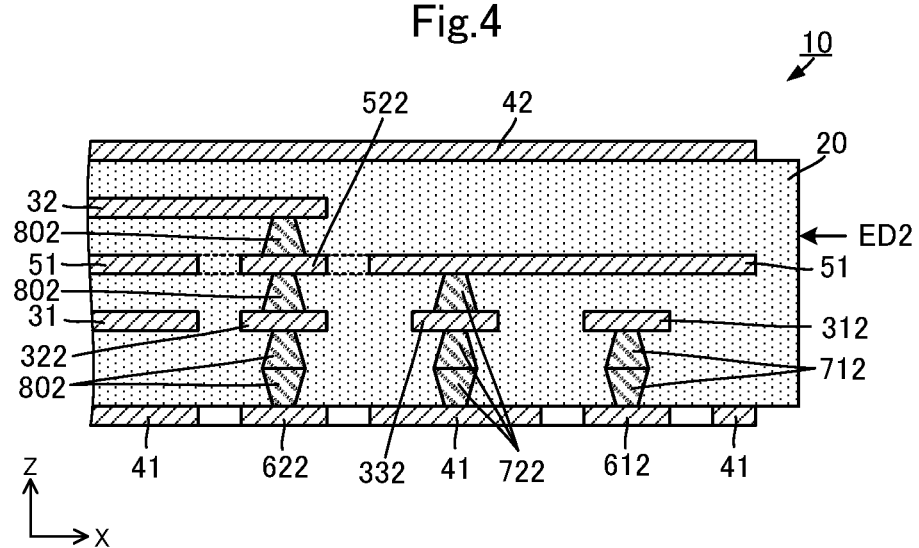
FIG. 4 is an enlarged sectional view of the second end portion of the multilayer substrate according to the first preferred embodiment of the present invention.

A multilayer substrate according to a first preferred embodiment of the present invention will be described with reference to the accompanying drawings. FIG. 1 is an exploded perspective view of the multilayer substrate according to the first preferred embodiment of the present invention. FIG. 2 is an external perspective view of the multilayer substrate according to the first preferred embodiment of the present invention. FIG. 3 is an enlarged exploded perspective view of a second end portion of the multilayer substrate according to the first preferred embodiment of the present invention. FIG. 4 is an enlarged sectional view of the second end portion of the multilayer substrate according to the first preferred embodiment of the present invention. FIG. 4 illustrates a section taken along line A-A illustrated in FIG. 3.

As illustrated in FIG. 1, a multilayer substrate 10 includes a laminate 20, signal conductors 31 and 32, ground conductors 41, 42, and 51, and external connection conductors 611, 612, 621, and 622.

As illustrated in FIG. 2, the laminate 20 has a rectangular or substantially rectangular shape in plan view. The laminate 20 has a shape long in X direction that is a main signal transmission direction, and short in Y direction perpendicular or substantially perpendicular to the X direction.

The ground conductor 41 and the external connection conductors 611, 612, 621, and 622 are provided on a back surface of the laminate 20. The ground conductor 42 is provided on the entire or substantially the entire front surface of the laminate 20.

As illustrated in FIG. 1, the laminate 20 is provided by laminating a plurality of dielectric layers 21, 22, 23, 24, and 25. The plurality of dielectric layers 21, 22, 23, 24, and 25 are disposed in this order from the back surface of the laminate 20. Each of the plurality of dielectric layers 21, 22, 23, 24, and 25 is made of a flexible base material, which includes a liquid crystal polymer as a main component, for example. The back surface of the laminate 20 corresponds to the "first surface".

The ground conductor 41 and the external connection conductors 611, 612, 621, and 622 are provided on the back surface of the dielectric layer 21 (the back surface of the laminate 20). The ground conductor 41 is provided on the entire or substantially the entire back surface of the laminate 20. The external connection conductors 611, 612, 621, and 622 are separated from the ground conductor 41 by a conductor non-provided portion.

The external connection conductors 611 and 621 are provided in a vicinity of a first end ED1 of the laminate 20 in the X direction. The external connection conductor 611 is disposed closer to the first end ED1 than the external connection conductor 621. The external connection conductors 612 and 622 are provided in a vicinity of a second end ED2 of the laminate 20 in the X direction. The external connection conductor 612 is disposed closer to the second end ED2 than the external connection conductor 622. The external connection conductors 611 and 612 each correspond to the "first external connection conductor". The external connection conductors 621 and 622 each correspond to the "second external connection conductor".

The dielectric layer 22 is provided on its front surface (its surface on a dielectric layer 23 side) with the signal conductor 31, wiring adjusting conductors 311 and 312, and interlayer-connection auxiliary conductors 321, 322, 331, and 332. The signal conductor 31 is a linear conductor extending in the X direction. The signal conductor 31 is provided at or substantially at the center of the dielectric layer 22 in the Y direction. The signal conductor 31 corresponds to the "first signal conductor".

The wiring adjusting conductor 311, and the interlayer-connection auxiliary conductors 321 and 331, are provided on a first end ED1 side of the signal conductor 31. The interlayer-connection auxiliary conductors 321 and 331 are provided at or substantially at the center of the dielectric layer 22 in the Y direction together with the signal conductor 31. The interlayer-connection auxiliary conductor 331 is provided closer to the first end ED1 than the interlayer-connection auxiliary conductor 321.

The wiring adjusting conductor 311 is provided on a front surface of the dielectric layer 22 so as to bypass a formation region of the interlayer-connection auxiliary conductors 321 and 331. The wiring adjusting conductor 311 has one end in its extending direction connected to the signal conductor 31, and the other end in the extending direction disposed between the first end ED1 and the interlayer-connection auxiliary conductor 331.

The wiring adjusting conductor 312, and the interlayer-connection auxiliary conductors 322 and 332, are provided on a second end ED2 side of the signal conductor 31. The interlayer-connection auxiliary conductors 322 and 332 are provided at or substantially at the center of the dielectric layer 22 in the Y direction together with the signal conductor 31. The interlayer-connection auxiliary conductor 332 is provided closer to the second end ED2 than the interlayer-connection auxiliary conductor 322.

The wiring adjusting conductor 312 is provided on a front surface of the dielectric layer 22 so as to bypass a formation region of the interlayer-connection auxiliary conductors 322 and 332. The wiring adjusting conductor 312 has one end in its extending direction connected to the signal conductor 31, and the other end in the extending direction disposed between the second end ED2 and the interlayer-connection auxiliary conductor 331.

More specifically, the wiring adjusting conductor 312 includes a plurality of conductor patterns 3121, 3122, and 3123 as illustrated in FIG. 3. The conductor patterns 3121 and 3123 each have a shape extending in the Y direction, and the conductor pattern 3122 has a shape extending in the X direction. The conductor pattern 3121 is connected at one end in its extending direction to the signal conductor 31, and at the other end to one end of the conductor pattern 3122. The conductor pattern 3122 partially overlaps with the formation region of the interlayer-connection auxiliary conductors 322 and 332 in the X direction, and is separated from the formation region of the interlayer-connection auxiliary conductors 322 and 332 in the Y direction. The conductor pattern 3122 is connected at the other end to one end of the conductor pattern 3123. The other end of the conductor pattern 3123 corresponds to the other end of the wiring adjusting conductor 312. As described above, the wiring adjusting conductor 312 is provided in a shape that surrounds half or substantially half of the formation region of the interlayer-connection auxiliary conductors 322 and 332 when the dielectric layer 22 is viewed in Z direction. While description is eliminated, a specific shape of the wiring adjusting conductor 311 described above is also similar to that of the wiring adjusting conductor 312.

The dielectric layer 23 is provided on its front surface (its surface on a dielectric layer 24 side) with a ground conductor 51, and interlayer-connection auxiliary conductors 521 and 522. The ground conductor 51 corresponds to the "intermediate ground conductor for a signal conductor". The ground conductor 51 is provided on the entire or substantially the entire front surface of the dielectric layer 23. The interlayer-connection auxiliary conductors 521 and 522 are separated from the ground conductor 51 by a conductor non-provided portion. The interlayer-connection auxiliary conductor 521 is provided in the vicinity of the first end ED1 of the dielectric layer 23 in the X direction. The interlayer-connection auxiliary conductor 521 overlaps with the interlayer-connection auxiliary conductor 321 in plan view from the lamination direction. The interlayer-connection auxiliary conductor 522 is provided in the vicinity of the second end ED2 of the dielectric layer 23 in the X direction. The interlayer-connection auxiliary conductor 522 overlaps with the interlayer-connection auxiliary conductor 322 in plan view from the lamination direction.

The dielectric layer 24 is provided on its front surface (its surface on a dielectric layer 25 side) with a signal conductor 32, and interlayer-connection auxiliary conductors 333 and 334. The signal conductor 32 is a linear conductor extending in the X direction. The signal conductor 32 is provided at or substantially at the center of the dielectric layer 24 in the Y direction. The signal conductor 32 corresponds to the "second signal conductor".

The signal conductor 32 has one end on a first end ED1 side that overlaps with the interlayer-connection auxiliary conductor 521 in plan view from the lamination direction. The signal conductor 32 has the other end on a second end ED2 side that overlaps with the interlayer-connection auxiliary conductor 522 in plan view from the lamination direction.

The interlayer-connection auxiliary conductor 333 is provided between the signal conductor 32 and the first end ED1 on the dielectric layer 24 in the X direction. The interlayer-connection auxiliary conductor 333 overlaps with the interlayer-connection auxiliary conductor 331 in the laminate 20.

The interlayer-connection auxiliary conductor 334 is provided between the signal conductor 32 and the second end ED2 on the dielectric layer 24 in the X direction. The interlayer-connection auxiliary conductor 334 overlaps with the interlayer-connection auxiliary conductor 332 in the laminate 20.

The dielectric layer 25 is provided entirely or substantially entirely on its front surface (the front surface of the laminate 20) with the ground conductor 42.

As illustrated in FIG. 1, the laminate 20 is provided with interlayer-connection conductors 711, 712, 721, 722, 801, and 802. The interlayer-connection conductors 711, 712, 721, 722, 801, and 802 are fabricated by providing through holes in predetermined dielectric layers, filling the through holes with conductive paste, and curing the conductive paste.

The interlayer-connection conductor 711 connects the external connection conductor 611 and the other end of the wiring adjusting conductor 311. The interlayer-connection conductor 712 connects the external connection conductor 612 and the other end of the wiring adjusting conductor 312, as illustrated in FIG. 4.

The interlayer-connection conductor 721 connects the external connection conductor 621 and one end of the signal conductor 32 via the interlayer-connection auxiliary conductors 321 and 521. The interlayer-connection conductor 722 connects the external connection conductor 622 and the other end of the signal conductor 32 via the interlayer-connection auxiliary conductors 322 and 522, as illustrated in FIG. 4.

The interlayer-connection conductor 801 connects the ground conductor 41, the ground conductor 51, and the ground conductor 42 via the interlayer-connection auxiliary conductors 331 and 333. The interlayer-connection conductor 802 connects the ground conductor 41, the ground conductor 51, and the ground conductor 42 via the interlayer-connection auxiliary conductors 332 and 334, as illustrated in FIG. 4.

The structure as described above causes the multilayer substrate 10 to include the two signal conductors 31 and 32 at respective positions different in the Z direction (lamination direction) in the laminate 20. The signal conductor 31 is sandwiched between the ground conductors 41 and 51 in the Z direction. This structure defines a first transmission line. The signal conductor 32 is sandwiched between the ground conductors 42 and 51 in the Z direction. This structure defines a second transmission line. This causes the multilayer substrate 10 to include the first transmission line and the second transmission line at respective positions different in the Z direction of the laminate 20.

The signal conductor 31 is connected at one end on a first end ED1 side to the external connection conductor 611 via the wiring adjusting conductor 311 and the interlayer-connection conductor 711. The wiring adjusting conductor 311 and the interlayer-connection conductor 711 define a conductor portion that corresponds to the "first wiring conductor". The signal conductor 31 is connected at the other end on a second end ED2 side to the external connection conductor 612 via the wiring adjusting conductor 312 and the interlayer-connection conductor 712. The wiring adjusting conductor 312 and the interlayer-connection conductor 712 define a conductor portion that corresponds to the "first wiring conductor".

The signal conductor 32 is connected at one end on a first end ED1 side to the external connection conductor 621 via the interlayer-connection conductor 721. The interlayer-connection conductor 721 defines a conductor portion that corresponds to the "second wiring conductor". The signal conductor 32 is connected at the other end on a second end ED2 side to the external connection conductor 622 via the interlayer-connection conductor 722. The interlayer-connection conductor 722 defines a conductor portion that corresponds to the "second wiring conductor".

Here, the wiring adjusting conductors 311 and 312 are appropriately adjusted for length. Specifically, a distance between the signal conductor 31 and the back surface of the laminate 20 is indicated as D1, and a distance between the signal conductor 32 and the back surface of the laminate 20 is indicated as D2.

The signal conductor 32 is farther from the back surface of the laminate 20 than the signal conductor 31, so that D1 is smaller than D2. Thus, the first wiring conductor provided by simply connecting the signal conductor 31 and the external connection conductors 611 and 612 with a conductor extending in the Z direction (e.g., one interlayer-connection conductor) has an inductance component (first inductance) that is smaller than an inductance component (second inductance) of the second wiring conductor provided by simply connecting the signal conductor 32 and the external connection conductors 621 and 622 with a conductor extending in the Z direction (e.g., one interlayer-connection conductor). Here, impedance of a conductor is proportional to a multiplied value of frequency and inductance of a transmission signal. Thus, a first impedance caused by the first inductance is smaller than a second impedance caused by the second inductance. This causes a difference between the first impedance and the second impedance. In particular, the impedance increases as the frequency of the transmission signal increases, so that a transmission signal with a high frequency causes an increase in the difference in impedance.

Because of this, the wiring adjusting conductors 311 and 312 are provided to define a portion functioning as an inductor between each of the ends of the signal conductor 31 and the corresponding one of the external connection conductors 611 and 612. The portion defining and functioning as an inductor increases the first impedance, and thus achieves a shape reducing the difference in impedance. In other words, the wiring adjusting conductors 311 and 312 are each provided with a length that reduces the difference between the first impedance and the second impedance. In particular, when the transmission signal is a high frequency signal, an effect of reducing the impedance difference increases.

As a result, the impedance of the first transmission line including the signal conductor 31 with respect to the outside and the impedance of the second transmission line having the signal conductor 32 with respect to the outside are substantially the same. Thus, when a circuit with the first transmission line connected and a circuit with the second transmission line connected each have the same impedance, the first transmission line and the second transmission line is able to similarly transmit a high-frequency signal with low loss.

The multilayer substrate 10 according to the first preferred embodiment further includes the planar ground conductor 51 disposed between the signal conductor 31 and the signal conductor 32, so that isolation between the signal conductor 31 and the signal conductor 32 is able to be increased. In addition, the planar ground conductor 51 is also disposed between the wiring adjusting conductors 311 and 312, and the signal conductor 32. This enables isolation between the wiring adjusting conductors 311 and 312, and the signal conductor 32, to be increased.

The multilayer substrate 10 according to the first preferred embodiment includes the interlayer-connection auxiliary conductor 331 connected to the ground conductors 41, 42, and 51, being disposed between the interlayer-connection auxiliary conductor 321 connected to the signal conductor 32 and the other end of the wiring adjusting conductor 311 connected to the signal conductor 31. This enables isolation between the interlayer-connection auxiliary conductor 321 and the wiring adjusting conductor 311 to be increased in the vicinity of the first end ED1 of the laminate 20, so that isolation between the signal conductor 32 and the signal conductor 31 is able to be increased. Likewise, the multilayer substrate 10 according to this preferred embodiment includes the interlayer-connection auxiliary conductors 332 connected to the ground conductors 41, 42, and 51, being disposed between the interlayer-connection auxiliary conductor 322 connected to the signal conductor 32 and the other end of the wiring adjusting conductor 312 connected to the signal conductor 31. This enables isolation between the interlayer-connection auxiliary conductor 322 and the wiring adjusting conductor 312 to be increased in the vicinity of the second end ED2 of the laminate 20, so that the isolation between the signal conductor 32 and the signal conductor 31 is able to be increased.

The multilayer substrate 10 of the first preferred embodiment includes the wiring adjusting conductors 311 and 312 that are provided on one surface, so that an individual dielectric layer for defining the wiring adjusting conductors 311 and 312 does not need to be separately provided. This enables the multilayer substrate 10 to be reduced in dimension (thickness) in the Z direction. In addition, the structure of the multilayer substrate 10 enables the number of interlayer-connection conductors used for a wiring adjusting portion to be reduced, so that the wiring adjusting portion is improved in connection reliability. Further, conductor loss is less likely to occur in planar conductors than in interlayer-connection conductors, so that conductor loss in the wiring adjusting portion is less likely to increase in the structure of the multilayer substrate 10.

While the multilayer substrate 10 of the first preferred embodiment preferably has a structure in which the wiring adjusting conductors 311 and 312 are provided so as to bypass the corresponding placement positions of the second wiring conductors (the interlayer-connection auxiliary conductors 321 and 322, etc.), the present invention is not limited to this structure. The second wiring conductor may be provided so as to bypass the placement position of the first wiring conductor or the ground conductor. That is, a wiring adjusting conductor may be provided in the second wiring conductor. In that case, to enhance symmetry in wiring length between the first wiring conductor and the second wiring conductor, it is preferable that a wiring adjusting conductor on a first wiring conductor side is provided so as to further bypass a wiring adjusting conductor on a second wiring conductor side as viewed in the lamination direction (Z direction).

Second Preferred Embodiment

Figure 5:
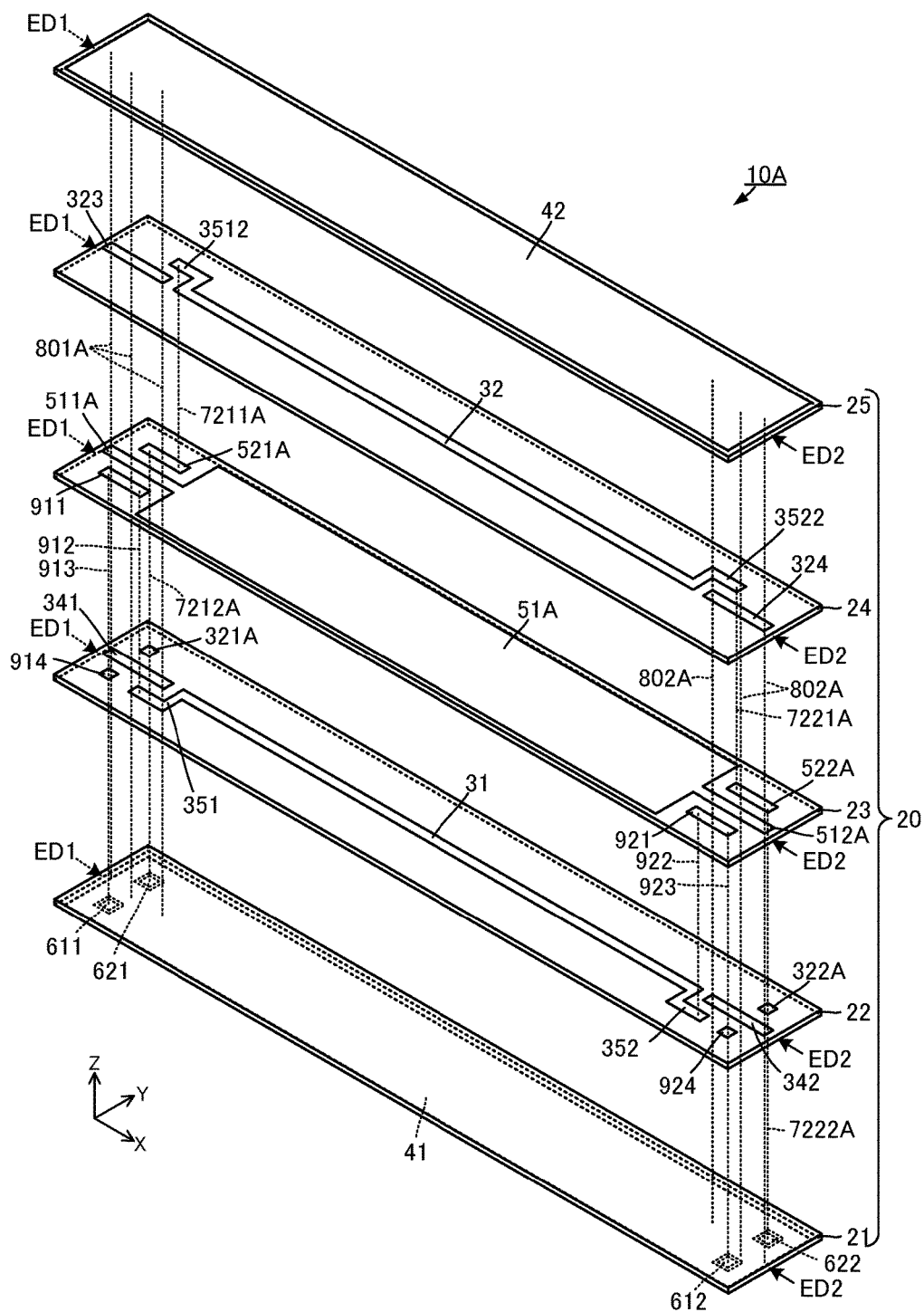
FIG. 5 is an exploded perspective view of a multilayer substrate according to a second preferred embodiment of the present invention.

Next, a multilayer substrate according to a second preferred embodiment of the present invention will be described with reference to the accompanying drawings. FIG. 5 is an exploded perspective view of the multilayer substrate according to the second preferred embodiment of the present invention.

A multilayer substrate 10A according to the second preferred embodiment is different from the multilayer substrate 10 according to the first preferred embodiment in structure of portions in signal conductors 31 and 32 in the X direction, near a first end ED1 and a second end ED2. Hereinafter, differences therebetween will be described in detail.

The multilayer substrate 10A includes a laminate 20, and the laminate 20 includes dielectric layers 21, 22, 23, 24, and 25.

The ground conductor 41 and the external connection conductors 611, 612, 621, and 622 are provided on the back surface of the dielectric layer 21 (the back surface of the laminate 20). The ground conductor 41 is provided on the entire or substantially the entire back surface of the laminate 20. The external connection conductors 611, 612, 621, and 622 are separated from the ground conductor 41 by a conductor non-provided portion.

The external connection conductors 611 and 621 are provided in the vicinity of a first end ED1 of the laminate 20 in the X direction. The external connection conductors 611 and 621 are disposed side by side in the Y direction. The external connection conductors 612 and 622 are provided in the vicinity of a second end ED2 of the laminate 20 in the X direction. The external connection conductors 612 and 622 are disposed side by side in the Y direction. The external connection conductors 611 and 612 each correspond to the "first external connection conductor". The external connection conductors 621 and 622 each correspond to the "second external connection conductor".

The dielectric layer 22 is provided on its front surface (its surface on a dielectric layer 23 side) with the signal conductor 31, end conductors 351 and 352, and interlayer connection auxiliary conductors 321A, 322A, 341, 342, 914, and 924. The signal conductor 31 is a linear conductor extending in the X direction. The signal conductor 31 is provided at or substantially at the center of the dielectric layer 22 in the Y direction. The signal conductor 31 corresponds to the "first signal conductor".

The end conductor 351 is connected to an end of the signal conductor 31 on its first end ED1 side. The end conductor 351 has a bent shape having a portion extending in the Y direction and a portion extending in the X direction. The portion extending in the Y direction of the end conductor 351 is connected to the signal conductor 31. The end conductor 351 is bent toward the external connection conductor 611 in the Y direction.

The interlayer-connection auxiliary conductor 914 is provided between the portion extending in the X direction of the end conductor 351 and the first end ED1 in the X direction. In the Y direction, the interlayer-connection auxiliary conductor 914 and the portion extending in the X direction of the end conductor 351 are provided at or substantially at the same position. The interlayer-connection auxiliary conductor 914 overlaps with the external connection conductor 611 in plan view from the lamination direction.

The interlayer-connection auxiliary conductor 341 is provided between the signal conductor 31 and the first end ED1 in the X direction. The interlayer-connection auxiliary conductor 341 has a shape extending in the X direction, and is positioned in the X direction so as to overlap with a part of the portion extending in the X direction of the end conductor 351 and the interlayer-connection auxiliary conductor 914.

The interlayer-connection auxiliary conductor 321A is provided at or substantially at the same position as the interlayer-connection auxiliary conductor 914 in the X direction. The interlayer-connection auxiliary conductor 321A is provided opposite to the interlayer-connection auxiliary conductor 914 across the interlayer-connection auxiliary conductor 341 in the Y direction. The interlayer-connection auxiliary conductor 321A overlaps with the external connection conductor 621 in plan view from the lamination direction.

The end conductor 352 is connected to an end of the signal conductor 31 on its second end ED2 side. The end conductor 352 has a bent shape having a portion extending in the Y direction and a portion extending in the X direction.

The portion extending in the Y direction of the end conductor 352 is connected to the signal conductor 32. The end conductor 352 is bent toward the external connection conductor 612 in the Y direction.

The interlayer-connection auxiliary conductor 924 is provided between the portion extending in the X direction of the end conductor 352 and the first end ED1 in the X direction. In the Y direction, the interlayer-connection auxiliary conductor 924 and the portion extending in the X direction of the end conductor 352 are provided at or substantially at the same position. The interlayer-connection auxiliary conductor 924 overlaps with the external connection conductor 612 in plan view from the lamination direction.

The interlayer-connection auxiliary conductor 342 is provided between the signal conductor 31 and the second end ED2 in the X direction. The interlayer-connection auxiliary conductor 342 has a shape extending in the X direction, and is positioned in the X direction so as to overlap with a part of the portion extending in the X direction of the end conductor 352 and the interlayer-connection auxiliary conductor 924.

The interlayer-connection auxiliary conductor 322A is provided at or substantially at the same position as the interlayer-connection auxiliary conductor 924 in the X direction. The interlayer-connection auxiliary conductor 322A is provided opposite to the interlayer-connection auxiliary conductor 924 across the interlayer-connection auxiliary conductor 342 in the Y direction. The interlayer-connection auxiliary conductor 322A overlaps with the external connection conductor 622 in plan view from the lamination direction.

The dielectric layer 23 is provided on its front surface (its surface on a dielectric layer 24 side) with a ground conductor 51A, auxiliary ground conductors 511A and 512A, and interlayer-connection auxiliary conductors 521A, 522A, 911, and 921. The ground conductor 51A is provided on the entire or substantially the entire front surface of the dielectric layer 23 except for the vicinity of each of the first end ED1 and the second end ED2. The auxiliary ground conductors 511A and 512A, and the interlayer-connection conductors 801A and 802A, each correspond to the "intermediate conductor for a wiring conductor".

The auxiliary ground conductor 511A is provided on a first end ED1 side of the ground conductor 51A, and has a dimension in the Y direction, smaller than a dimension of the ground conductor 51A in the Y direction. The auxiliary ground conductor 511A is provided at or substantially at the center of the dielectric layer 23 in the Y direction. The auxiliary ground conductor 511A is connected to the ground conductor 51A.

The interlayer-connection auxiliary conductor 521A is provided between the ground conductor 51A and the first end ED1 in the X direction. The interlayer-connection auxiliary conductor 521A is provided at an interval from the auxiliary ground conductor 511A in the Y direction. The interlayer-connection auxiliary conductor 521A has one end overlapping with the interlayer-connection auxiliary conductor 321A and the external connection conductor 621 in plan view from the lamination direction. The interlayer-connection auxiliary conductor 521A, the interlayer-connection auxiliary conductor 321A, and the external connection conductor 621 are connected by an interlayer-connection conductor 7212A.

The interlayer-connection auxiliary conductor 911 is provided between the ground conductor 51A and the first end ED1 in the X direction. The interlayer-connection auxiliary conductor 911 is provided at an interval from the auxiliary ground conductor 511A in the Y direction. The interlayer-connection auxiliary conductor 911 is provided opposite to the interlayer-connection auxiliary conductor 521A in the Y direction with respect to the auxiliary ground conductor 511A.

The interlayer-connection auxiliary conductor 911 has one end overlapping with the interlayer-connection auxiliary conductor 914 and the external connection conductor 611 in plan view from the lamination direction. The interlayer-connection auxiliary conductor 911, the interlayer-connection auxiliary conductor 914, and the external connection conductor 611 are connected by the interlayer-connection conductor 913. The interlayer-connection auxiliary conductor 911 has the other end overlapping with the end conductor 351 in plan view from the lamination direction. The interlayer-connection auxiliary conductor 911 and the end conductor 351 are connected by an interlayer-connection conductor 912.

The auxiliary ground conductor 512A is provided on a second end ED2 side of the ground conductor 51A, and has a dimension in the Y direction, smaller than a dimension of the ground conductor 51A in the Y direction. The auxiliary ground conductor 512A is provided at or substantially at the center of the dielectric layer 23 in the Y direction. The auxiliary ground conductor 512A is connected to the ground conductor 51A.

The interlayer-connection auxiliary conductor 522A is provided between the ground conductor 51A and the second end ED2 in the X direction. The interlayer-connection auxiliary conductor 522A is provided at an interval from the auxiliary ground conductor 512A in the Y direction. The interlayer-connection auxiliary conductor 522A has one end overlapping with the interlayer-connection auxiliary conductor 322A and the external connection conductor 622 in plan view from the lamination direction. The interlayer-connection auxiliary conductor 522A, the interlayer-connection auxiliary conductor 322A, and the external connection conductor 622 are connected by an interlayer-connection conductor 7222A.

The interlayer-connection auxiliary conductor 921 is provided between the ground conductor 51A and the second end ED2 in the X direction. The interlayer-connection auxiliary conductor 921 is provided at an interval from the auxiliary ground conductor 512A in the Y direction. The interlayer-connection auxiliary conductor 921 is provided opposite to the interlayer-connection auxiliary conductor 522A in the Y direction with respect to the auxiliary ground conductor 512A.

The interlayer-connection auxiliary conductor 921 has one end overlapping with the interlayer-connection auxiliary conductor 924 and the external connection conductor 612 in plan view from the lamination direction. The interlayer-connection auxiliary conductor 921, the interlayer-connection auxiliary conductor 924, and the external connection conductor 612 are connected by the interlayer-connection conductor 923. The interlayer-connection auxiliary conductor 921 has the other end overlapping with the end conductor 352 in plan view from the lamination direction. The interlayer-connection auxiliary conductor 921 and the end conductor 352 are connected by an interlayer-connection conductor 922.

The dielectric layer 24 is provided on its front surface (its surface on a dielectric layer 25 side) with a signal conductor 32, end conductors 3512 and 3522, and interlayer-connection auxiliary conductors 323 and 324. The signal conductor 32 is a linear conductor extending in the X direction. The signal conductor 32 is provided at or substantially at the center of the dielectric layer 24 in the Y direction. The signal conductor 32 corresponds to the "second signal conductor".

The end conductor 3512 is connected to an end of the signal conductor 32 on its first end ED1 side. The end conductor 3512 has a bent shape having a portion extending in the Y direction and a portion extending in the X direction. The portion extending in the Y direction of the end conductor 3512 is connected to the signal conductor 32. The end conductor 3512 is bent toward the external connection conductor 621 in the Y direction. The portion extending in the X direction of the end conductor 3512 has an end overlapping with the other end of the interlayer-connection auxiliary conductor 521A in plan view from the lamination direction. The end conductor 3512 and the interlayer-connection auxiliary conductor 521A are connected by an interlayer-connection conductor 7211A.

The interlayer-connection auxiliary conductor 323 is provided between the signal conductor 32 and the first end ED1 in the X direction. The interlayer-connection auxiliary conductor 323 has a shape extending in the X direction, and is positioned in the X direction so as to overlap with a part of the portion extending in the X direction of the end conductor 3512.

The end conductor 3522 is connected to an end of the signal conductor 32 on its second end ED2 side. The end conductor 3522 has a bent shape having a portion extending in the Y direction and a portion extending in the X direction. The portion extending in the Y direction of the end conductor 3522 is connected to the signal conductor 32. The end conductor 352 is bent toward the external connection conductor 621 in the Y direction. The portion extending in the X direction of the end conductor 3522 has an end overlapping with the other end of the interlayer-connection auxiliary conductor 522A in plan view from the lamination direction. The end conductor 3522 and the interlayer-connection auxiliary conductor 522A are connected by an interlayer-connection conductor 7221A.

The interlayer-connection auxiliary conductor 324 is provided between the signal conductor 32 and the second end ED2 in the X direction. The interlayer-connection auxiliary conductor 324 has a shape extending in the X direction, and is positioned in the X direction so as to overlap with a part of the portion extending in the X direction of the end conductor 3522.

The dielectric layer 25 is provided on an entirety or substantially an entirety of its front surface (the front surface of the laminate 20) with the ground conductor 42.

The interlayer-connection conductor 801A connects the ground conductor 41, the interlayer-connection auxiliary conductor 341, the auxiliary ground conductor 511A, the interlayer-connection auxiliary conductor 323, and the ground conductor 42. A plurality of the interlayer-connection conductors 801A is provided at intervals along the X direction.

The interlayer-connection conductor 802A connects the ground conductor 41, the interlayer-connection auxiliary conductor 342, the auxiliary ground conductor 512A, the interlayer-connection auxiliary conductor 324, and the ground conductor 42. A plurality of the interlayer-connection conductors 802A is provided at intervals along the X direction.

This structure causes a conductor portion where the interlayer-connection conductor 912, the interlayer-connection auxiliary conductor 911, and the interlayer-connection conductor 913 are connected, to define and function as a wiring adjusting conductor on a first end ED1 side. In addition, a conductor portion where the interlayer-connection conductor 922, the interlayer-connection auxiliary conductor 921, and the interlayer-connection conductor 923 are connected, defines and functions as a wiring adjusting conductor on a second end ED2 side.

As described above, the multilayer substrate 10A according to the second preferred embodiment includes the wiring adjusting conductors each having a shape bending from the position of the signal conductor 31 toward the position of the signal conductor 32 in the Z direction. As in the first preferred embodiment, these wiring adjusting conductors are each set to a shape that reduces a difference in impedance between a wiring portion for the signal conductor 31 and a wiring portion for the signal conductor 32. As a result, as in the first preferred embodiment, the impedance of the first transmission line having the signal conductor 31 with respect to the outside and the impedance of the second transmission line having the signal conductor 32 with respect to the outside are substantially the same. Thus, when a circuit with the first transmission line connected and a circuit with the second transmission line connected each have the same impedance, the first transmission line and the second transmission line are able to similarly transmit a high-frequency signal with low loss.

Using the structure of the multilayer substrate 10A enables the wiring adjusting conductor to be reduced in length for a portion extending in the Y direction. This enables the multilayer substrate 10A to be reduced in dimension (length in width direction) in the Y direction. This also enables inductance components to be set equally in interlayer-connection conductors each have the same line length, so that design of a shape to reduce a difference in impedance is able to be facilitated. In addition, an inductance component is able to be increased without increasing a dimension of the wiring adjusting conductor in the Y direction, so that a wiring adjusting portion for the signal conductor 31 and the interlayer-connection conductors 7212A and 7222A for the signal conductor 32 are able to be prevented from joining with each other by using the auxiliary ground conductor 511A and 512A, the interlayer-connection conductors 801A and 802A. This causes isolation between the first transmission line and the second transmission line to be easily increased.

In addition, using the structure of the multilayer substrate 10A causes a portion of the wiring adjusting conductor to be provided on the same surface as the ground conductor 51A. As a result, an individual layer to define a wiring adjusting conductor does not need to be provided, so that the multilayer substrate 10A is able to be reduced in dimension in the Z direction (length (thickness) in the lamination direction).

The multilayer substrate 10A has the structure in which the signal conductor 31 and the signal conductor 32 have respective bent portions that are bent opposite to each other in the Y direction. This enables increase in isolation between the wiring portion for the signal conductor 31 and the wiring portion for the signal conductor 32. The bent portions provided in the respective signal conductors improve design flexibility of the wiring portions, so that design flexibility in shape of the wiring adjusting conductor is improved. This causes a structure to reduce a difference in impedance to be easily achieved.

The multilayer substrate 10A has the structure in which the auxiliary ground conductors 511A and 512A, and the interlayer-connection auxiliary conductors 323, 324, 341, and 342, are disposed between the wiring portion for the signal conductor 31 and the wiring portion for the signal conductor 32. The auxiliary ground conductors 511A and 512A, and the interlayer-connection auxiliary conductors 323, 324, 341, and 342, are connected to the ground conductors 41, 42, and 51A by the corresponding interlayer-connection conductors 801A and 802A extending in the Z direction. This enables achieving high isolation between the wiring portion for the signal conductor 31 and the wiring portion for the signal conductor 32 in the Y direction and the Z direction. In addition, the auxiliary ground conductors 511A and 512A, and the interlayer-connection auxiliary conductors 323, 324, 341, and 342, each have a shape extending in the X direction, so that higher isolation is able to be achieved.

The multilayer substrate 10A includes the plurality of dielectric layers 21, 22, 23, and 24 each of which has the same thickness. As a result, the interlayer-connection conductors (interlayer-connection conductors 922 and 923) of the first wiring conductor are identical in wiring length to the interlayer-connection conductors (interlayer-connection conductors 7221A and 7222A) of the second wiring conductor. This structure enables the first wiring conductor and the second wiring conductor to be equal or substantially equal in wiring length, so that symmetry between the first wiring conductor and the second wiring conductor is able to be enhanced.

The interlayer-connection auxiliary conductors 521A and 522A each may be used as a wiring adjusting conductor for the signal conductor 32. This enables both of the signal conductor 31 and the signal conductor 32 to be connected to the respective wiring adjusting conductors, so that a difference in impedance is able to be reduced more accurately within a wide impedance range.

Third Preferred Embodiment

Figure 6:
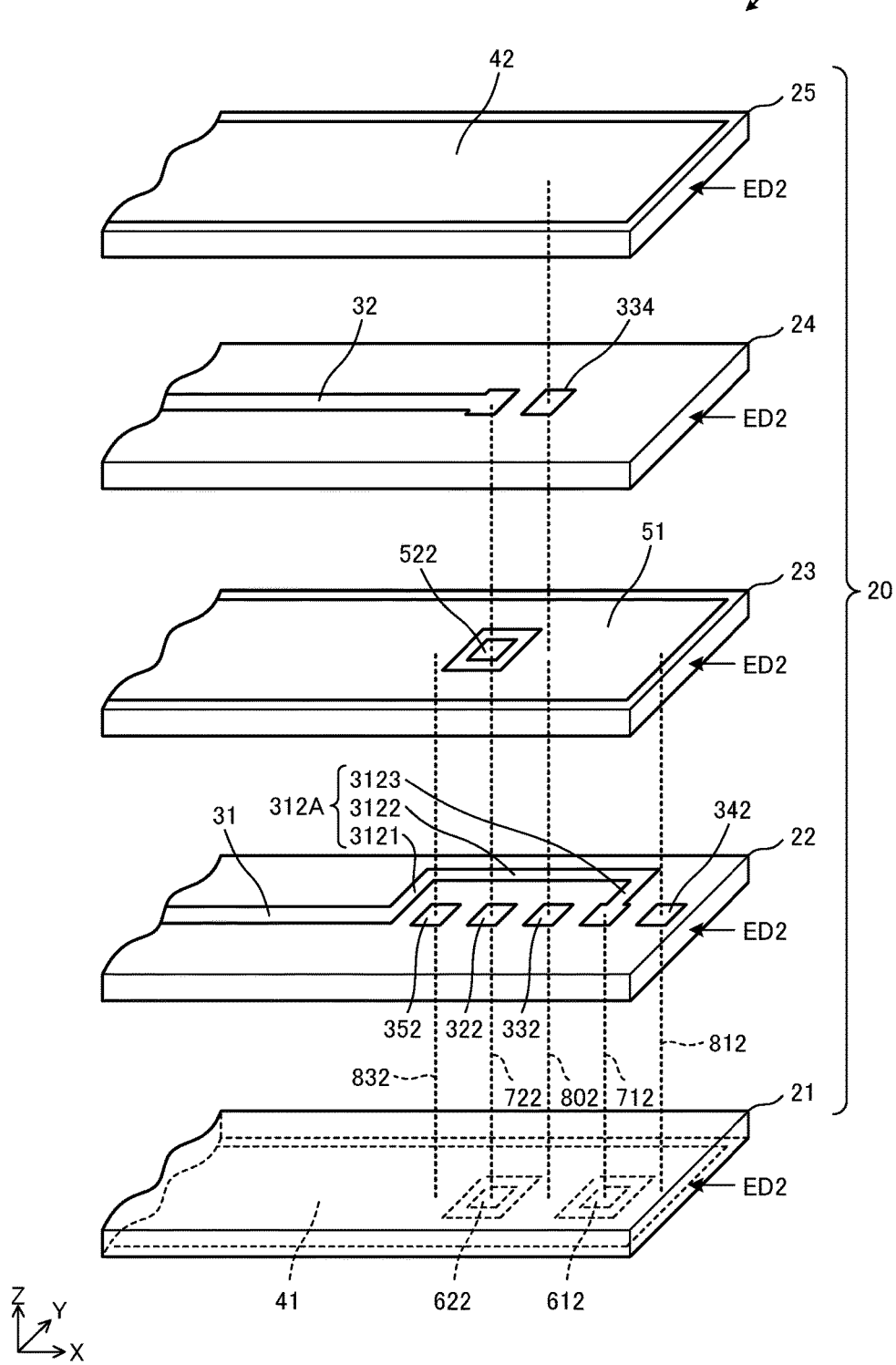
FIG. 6 is an enlarged exploded perspective view of a second end portion of a multilayer substrate 10B according to a third preferred embodiment of the present invention.
Figure 7:
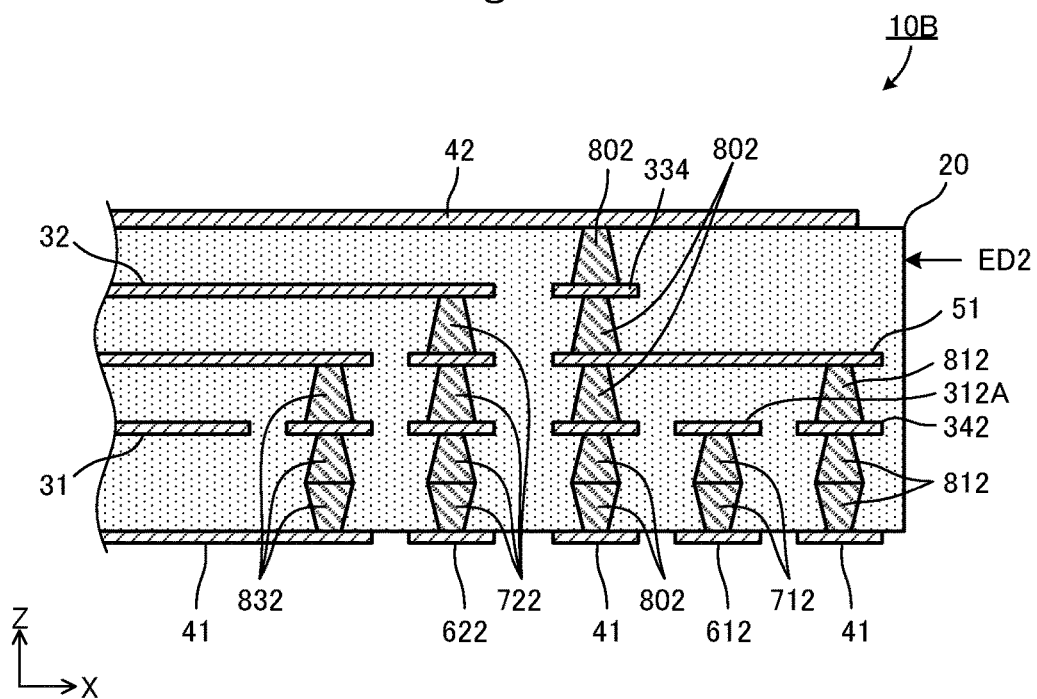
FIG. 7 is an enlarged sectional view of the second end portion of the multilayer substrate 10B according to the third preferred embodiment of the present invention.

Next, a multilayer substrate according to a third preferred embodiment of the present invention will be described with reference to the accompanying drawings. FIG. 6 is an enlarged exploded perspective view of a second end portion of a multilayer substrate 10B according to the third preferred embodiment of the present invention. FIG. 7 is an enlarged sectional view of the second end portion of the multilayer substrate 10B according to the third preferred embodiment.

The multilayer substrate 10B according to the third preferred embodiment is different from the multilayer substrate 10 according to the first preferred embodiment in structure of a wiring adjusting conductor 312A. Other structures are the same as those of the multilayer substrate 10. Hereinafter, differences therebetween will be described in detail.

In the third preferred embodiment, the wiring adjusting portion includes a planar conductor. Specifically, the wiring adjusting conductor 312A includes planar conductors of a plurality of conductor patterns 3121, 3122, and 3123, as illustrated in FIG. 6. In the third preferred embodiment, the wiring adjusting conductor 312A (the plurality of conductor patterns 3121, 3122, and 3123) has a line width narrower than that of the signal conductor 31. While description is eliminated, a specific structure of a wiring adjusting conductor on a first end side (corresponding to the wiring adjusting conductor 311 illustrated in FIG. 1) is also similar to that of the wiring adjusting conductor 312A.

This structure enables a first inductance (an inductance component of a first wiring conductor) to be increased without excessively increasing a line length of the wiring adjusting conductor 312A.

It is conceivable to increase an interlayer-connection conductor 712 in length (or reduce the interlayer-connection conductor 712 in diameter) to increase an inductance component. However, when the interlayer-connection conductor 712 is increased in length (or when the interlayer-connection conductor 712 is reduced in diameter), conductor loss of the first wiring conductor increases. Thus, it is preferable to increase a first inductance by narrowing a line width of the wiring adjusting conductor 312A that is a planar conductor, as shown in the third preferred embodiment.

Fourth Preferred Embodiment

Figure 8:
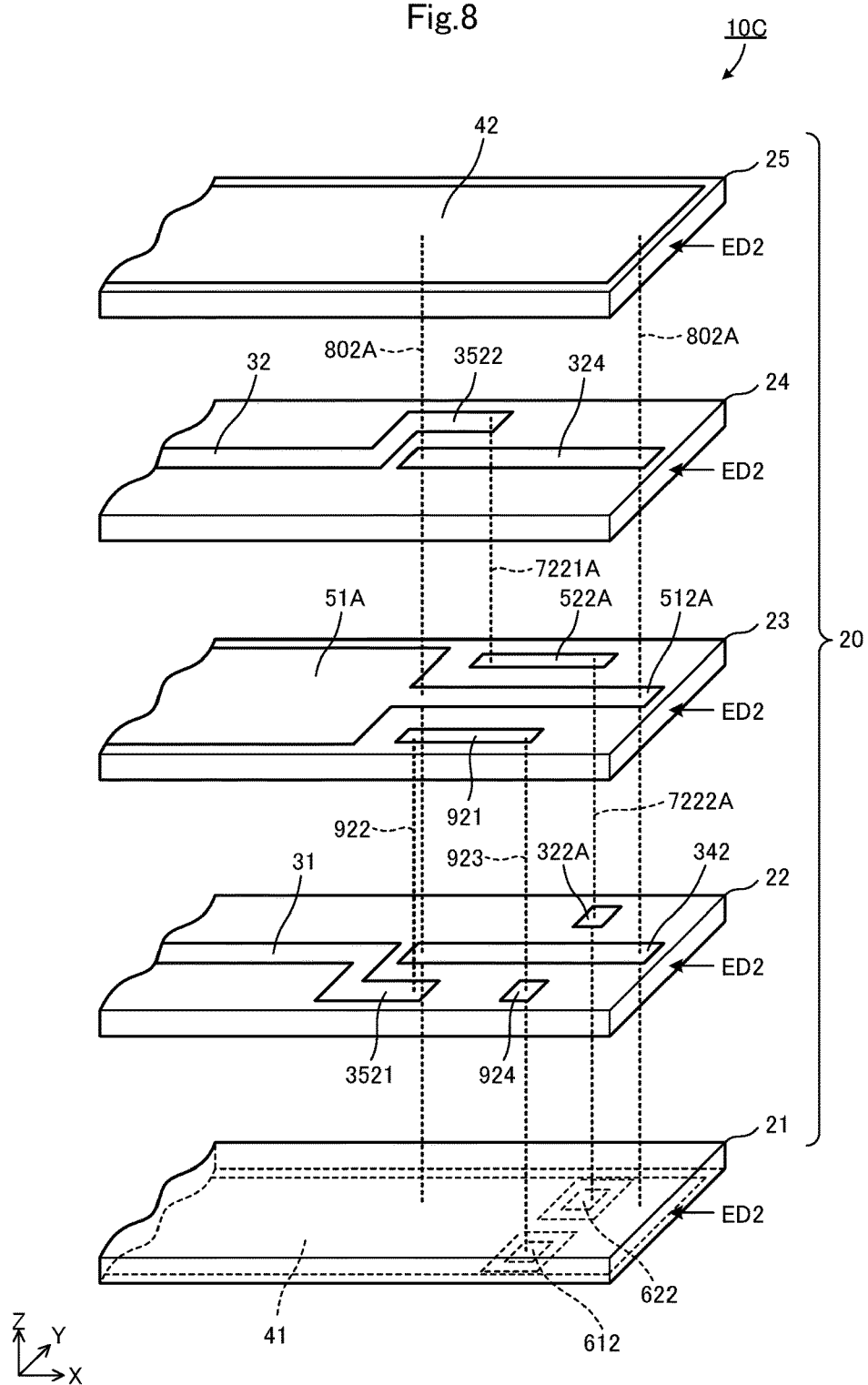
FIG. 8 is an enlarged exploded perspective view of a second end portion of a multilayer substrate 10C according to a fourth preferred embodiment of the present invention.

Next, a multilayer substrate according to a fourth preferred embodiment of the present invention will be described with reference to the accompanying drawings. FIG. 8 is an enlarged exploded perspective view of a second end portion of a multilayer substrate 10C according to the fourth preferred embodiment of the present invention.

The multilayer substrate 10C according to the fourth preferred embodiment is different from the multilayer substrate 10A according to the second preferred embodiment in structure of a wiring adjusting conductor. Other structures are the same as those of the multilayer substrate 10A. Hereinafter, differences therebetween will be described in detail.

As illustrated in FIG. 8, the fourth preferred embodiment shows that interlayer-connection auxiliary conductors 522A and 921 each are a planar conductor and have a line width narrower than that of each of signal conductors 31 and 32, being a plane conductor. While specific description is eliminated, a specific structure of each of interlayer-connection auxiliary conductors on a first end side (corresponding to the interlayer-connection auxiliary conductor 521A and 911 illustrated in FIG. 5) is also similar to that of the corresponding one of the interlayer-connection auxiliary conductors 522A and 921.

This structure enables a first inductance to be increased without excessively increasing a line length of the wiring adjusting conductor including an interlayer-connection conductor 922, the interlayer-connection auxiliary conductor 921, and an interlayer-connection conductor 923.

This structure also enables a second inductance component (an inductance component of a second wiring conductor) to be increased without excessively increasing a line length of the second wiring conductor. Thus, adjusting both the first inductance and the second inductance enables an effect of reducing a difference between the first impedance and the second impedance to be enhanced.

It is conceivable to increase interlayer-connection conductors 922, 923, 7221A, and 7222A in length (or reduce the interlayer-connection conductor 922, 923, 7221A, and 7222A in diameter) to increase an inductance component of the first or second wiring conductor. However, when the interlayer-connection conductors 922, 923, 7221A, and 7222A are increased in length (or when the interlayer-connection conductors 922, 923, 7221A, and 7222A are reduced in diameter), conductor loss increases. Thus, it is preferable to increase an inductance component by narrowing a line width of each of the interlayer-connection auxiliary conductors 522A and 921, being a planar conductor, as shown in the fourth preferred embodiment.

Fifth Preferred Embodiment

Figure 9:
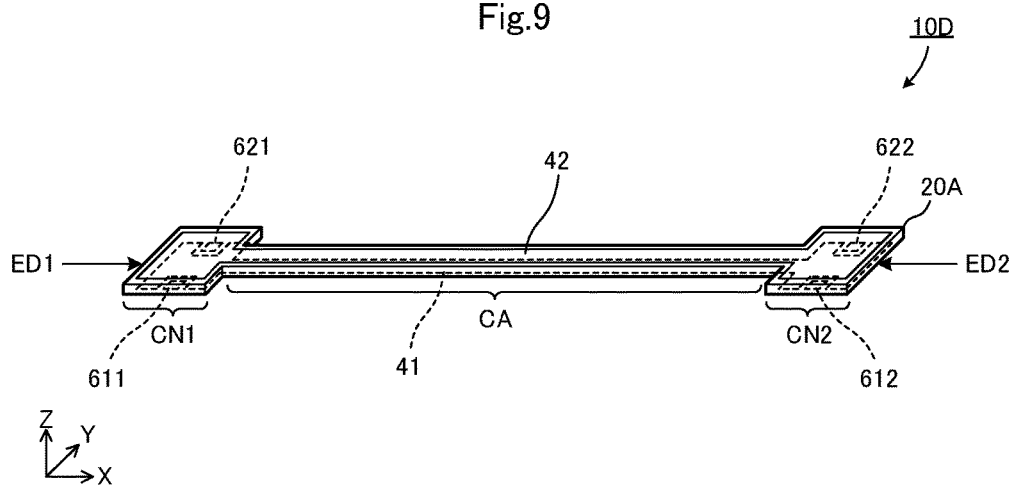
FIG. 9 is an external perspective view of a multilayer substrate 10D according to a fifth preferred embodiment of the present invention.
Figure 10:
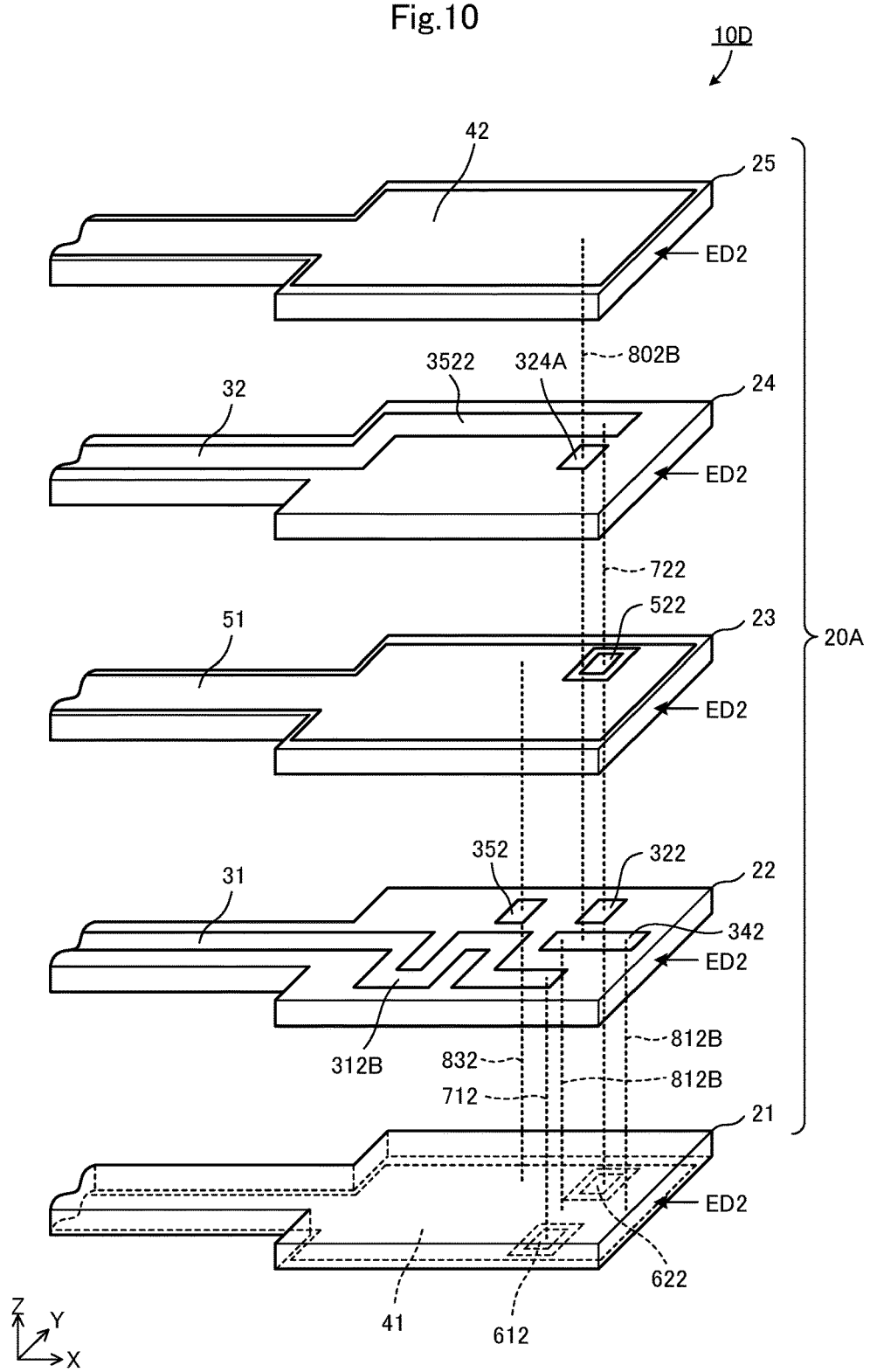
FIG. 10 is an enlarged exploded perspective view of a second end portion of the multilayer substrate 10D according to the fifth preferred embodiment of the present invention.

Next, a multilayer substrate according to a fifth preferred embodiment of the present invention will be described with reference to the accompanying drawings. FIG. 9 is an external perspective view of a multilayer substrate 10D according to the fifth preferred embodiment of the present invention. FIG. 10 is an enlarged exploded perspective view of a second end portion of the multilayer substrate 10D according to the fifth preferred embodiment of the present invention.

The multilayer substrate 10D according to the fifth preferred embodiment is different from the multilayer substrate 10 according to the first preferred embodiment in shape of a laminate. The multilayer substrate 10D is also different from the multilayer substrate 10 in shape of a wiring adjusting conductor. Other structures are substantially the same as those of the multilayer substrate 10. Hereinafter, differences therebetween will be described in detail.

The multilayer substrate 10D includes a laminate 20A, and the laminate 20A includes dielectric layers 21, 22, 23, 24, and 25.

The dielectric layer 21 is provided on its back surface (a back surface of the laminate 20A) with a ground conductor 41, and external connection conductors 611, 612, 621, and 622. The ground conductor 41 is provided on the entire or substantially the entire back surface of the laminate 20A. The external connection conductors 611, 612, 621, and 622 are separated from the ground conductor 41 by a conductor non-provided portion.

The external connection conductors 611 and 621 are provided in the vicinity of a first end ED1 of the laminate 20A in the X direction. The external connection conductors 611 and 621 are disposed side by side in the Y direction. The external connection conductors 612 and 622 are provided in the vicinity of a second end ED2 of the laminate 20A in the X direction. The external connection conductors 612 and 622 are disposed side by side in the Y direction. The external connection conductors 611 and 612 each correspond to the "first external connection conductor". The external connection conductors 621 and 622 each correspond to the "second external connection conductor".

The dielectric layer 22 is provided on its front surface (its surface on a dielectric layer 23 side) with the signal conductor 31, a wiring adjusting conductor 312B, interlayer-connection auxiliary conductors 322 and 342, an end conductor 352, and the like. The signal conductor 31 is a linear conductor extending in the X direction. The signal conductor 31 is provided at or substantially at the center of the dielectric layer 22 in the Y direction. The signal conductor 31 corresponds to the "first signal conductor".

The wiring adjusting conductor 312B, the interlayer-connection auxiliary conductors 322 and 342, and the end conductor 352 are provided on a second end ED2 side of the signal conductor 31. The interlayer connection auxiliary conductor 342 is provided at or substantially at the center of the dielectric layer 22 in the Y direction together with the signal conductor 31.

The wiring adjusting conductor 312B is connected to an end of the signal conductor 31 on its second end ED2 side. The wiring adjusting conductor 312B has a meander shape having a portion extending in the Y direction and a portion extending in the X direction. In addition, the wiring adjusting conductor may have a looped winding shape of a spiral shape, a loop shape, or the like. The portion extending in the Y direction of the wiring adjusting conductor 312B is connected to the signal conductor 31. A part of the wiring adjusting conductor 312B overlaps with the external connection conductor 612 in plan view from the lamination direction. The wiring adjusting conductor 312B and the external connection conductor 612 are connected by the interlayer-connection conductor 712. While description is eliminated, a wiring adjusting conductor and an interlayer-connection auxiliary conductor, similar to the above, are provided in an end portion on a first end ED1 side.

The dielectric layer 23 is provided on its front surface (its surface on a dielectric layer 24 side) with a ground conductor 51, an interlayer connection auxiliary conductor 522, and the like. The ground conductor 51 is provided on the entire or substantially the entire front surface of the dielectric layer 23. The interlayer-connection auxiliary conductor 522 is provided in the vicinity of the second end ED2 of the dielectric layer 23 in the X direction. The interlayer connection auxiliary conductor 522 is separated from the ground conductor 51 by an electrode non-provided portion. While description is eliminated, an interlayer-connection auxiliary conductor similar to the above is provided in the vicinity of the first end ED1.

The dielectric layer 24 is provided on its front surface (its surface on a dielectric layer 25 side) with a signal conductor 32, an end conductor 3522, an interlayer-connection auxiliary conductor 324A, and the like. The signal conductor 32 is a linear conductor extending in the X direction. The signal conductor 32 is provided at or substantially at the center of the dielectric layer 24 in the Y direction. The signal conductor 32 corresponds to the "second signal conductor".

The end conductor 3522 is connected to a second end of the signal conductor 32. The end conductor 3522 has a bent shape having a portion extending in the Y direction and a portion extending in the X direction. The portion extending in the Y direction of the end conductor 3522 is connected to the signal conductor 32. The portion extending in the X direction of the end conductor 3522 has an end overlapping with the interlayer-connection auxiliary conductor 522 in plan view from the lamination direction. The end conductor 3522, the interlayer-connection auxiliary conductors 322 and 522, and the external connection conductor 622 are connected by an interlayer-connection conductor 722. While description is eliminated, an end conductor similar to the above is provided in the vicinity of the first end ED1.

The dielectric layer 25 is provided on entirety or substantially an entirety of its front surface (the front surface of the laminate 20A) with the ground conductor 42.

The interlayer-connection conductor 802B connects the ground conductor 42, the interlayer-connection auxiliary conductor 324A, the ground conductor 51, and the interlayer-connection auxiliary conductor 342. The interlayer-connection conductor 832 connects the ground conductor 51, the end conductor 352, and the ground conductor 41. The interlayer-connection conductor 812B connects the interlayer-connection auxiliary conductor 342 and the ground conductor 41. A plurality of the interlayer-connection conductors 812B is provided at intervals along the X direction.

As illustrated in FIG. 9, the laminate 20A includes a wiring portion CA, a first connection portion CN1, and a second connection portion CN2. The first connection portion CN1 and the second connection portion CN2 are each a rectangular or substantially rectangular portion for connection to another circuit. The wiring portion CA extends in the Y direction to connect the first connection portion CN1 and the second connection portion CN2 to each other.

In addition, as illustrated in FIG. 9, the first connection portion CN1 and the second connection portion CN2 are wider in the X direction than the wiring portion CA.

Figure 11:
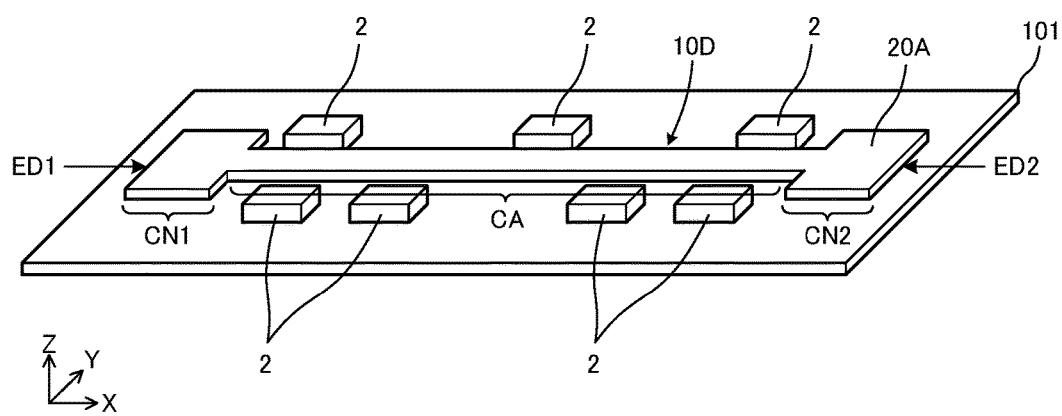
FIG. 11 is an external perspective view illustrating a main part of an electronic device 201 according to the fifth preferred embodiment of the present invention.

Next, a state where the multilayer substrate 10D is mounted on a circuit board or the like will be described with reference to the drawings. FIG. 11 is an external perspective view illustrating a main portion of an electronic device 201 according to the fifth preferred embodiment.

The electronic device 201 includes the multilayer substrate 10D, a circuit board 101, a plurality of surface mount components 2, and the like. The circuit board 101 is a printed wiring board, for example. The surface mount component 2 is a chip component (a chip inductor, a chip capacitor, or the like), an IC, or the like, for example.

As illustrated in FIG. 11, the circuit board 101 is provided on its front surface with the plurality of surface mount components 2 mounted. The multilayer substrate 10D is mounted on the front surface of the circuit board 101 so as to avoid the plurality of surface components 2. Specifically, the multilayer substrate 10D is bonded to the front surface of the circuit board 101 with a conductive bonding material such as solder. That is, the fifth preferred embodiment shows that the external connection conductors (611, 612, 621, and 622) of the first connection portion CN1 and the second connection portion CN2 are bonded to the corresponding conductors provided on the front surface of the circuit board 101.

The electronic device 201 according to the fifth preferred embodiment achieves the following effects.

The fifth preferred embodiment shows that the multilayer substrate 10D according to the fifth preferred embodiment includes the first connection portion CN1 and the second connection portion CN2 that are wider than the wiring portion CA. This structure increases a connection area of the multilayer substrate 10D to increase connection strength to the circuit board 101 and the like. In addition, even when the multilayer substrate 10D having an elongated shape is disposed on the front surface of the circuit board 101 or the like, this structure enables the multilayer substrate 10D not to easily fall over. That is, this structure enhances stability of the multilayer substrate 10D disposed on the front surface of the circuit board 101 or the like, and enables mountability of the multilayer substrate 10D to be enhanced. This structure also enables a connector or the like to be easily mounted on each of the first connection portion CN1 and the second connection portion CN2 even when the multilayer substrate 10D has an elongated shape.

In addition, the fifth preferred embodiment shows that the wiring portion CA is narrower than each of the first connection portion CN1 and the second connection portion CN2. As illustrated in FIG. 11, this structure enables the wiring portion CA of the multilayer substrate 10D to be led into a limited narrow space (a position avoiding other surface mount components and structures), so that the multilayer substrate 10D is able to be disposed in a narrow space.

The multilayer substrate 10D according to the fifth preferred embodiment includes the wiring adjusting conductor 312B in a winding shape that is disposed in the connection portion (second connection portion). This structure causes a wiring adjusting conductor in a winding shape to be disposed on the connection portion having a relatively large width, so that a line width of the wiring adjusting conductor can be increased. This enables an inductance component to be increased while reducing or preventing an increase in conductor loss of the first wiring conductor, as compared with the case where the wiring adjusting conductor is narrowed in line width. Disposing wiring adjusting conductors at respective connection portions (the first connection portion CA1 and the second connection portion CA2) each having a relatively large width enables the wiring portion CA to be led into a limited narrow space, so that the multilayer substrate 10D with the first inductance increased is able to be achieved.

The fifth preferred embodiment includes the multilayer substrate 10D that is bonded to the circuit board 101 with a conductive bonding material. That is, the multilayer substrate is connected to the circuit board or the like without using a connector or a receptacle, so that transmission loss is reduced as compared with the case where a multilayer substrate is connected to a circuit board or the like using a connector and a receptacle.

The fifth preferred embodiment shows that a portion of the wiring adjusting conductor is not provided on the same surface as the ground conductor 51, as in the multilayer substrate 10A according to the second preferred embodiment. This increases an area of the ground conductor 51 as compared with the case where a portion of the wiring adjusting conductor is provided on the same surface as the ground conductor 51, so that a ground potential is stabilized. In addition, the multilayer substrate 10D according to the fifth preferred embodiment includes the planar ground conductor 51 disposed between the end conductor 3522 and the wiring adjusting conductor 312B, so that isolation between the first wiring conductor and the second wiring conductor is able to be increased.

Other Preferred Embodiments

The multilayer substrates 10, 10A, 10B, 10C, and 10D according to the preferred embodiments of the present invention described above each may be configured or structured to cause the laminate 20 to branch between a wiring portion for the signal conductor 31 and a wiring portion for the signal conductor 32.

Each of the preferred embodiments of the present invention described above shows that the two signal conductors 31 and 32 are provided. However, the structure of the wiring portions described above is also able to be applied to a structure in which three or more signal conductors are disposed in the Z direction.

Each of the preferred embodiments described above shows that the ground conductors 51 and 51A are disposed between the two signal conductors 31 and 32. However, when the two signal conductors 31 and 32 are used for transmission of a differential signal, the ground conductor between the two signal conductors 31 and 32, and the ground conductor between the wiring portion of the signal conductor 31 and the wiring portion of the signal conductor 32, are eliminated. Even for such a multilayer substrate that transmits a differential signal, the structure to reduce a difference in impedance, described above, can be applied. In this case, a wiring adjusting conductor or the like is provided such that an electric length to the wiring portion of the signal conductor 31 therefrom is the same as an electric length to the wiring portion of the signal conductor 32 therefrom.

While each of the preferred embodiments of the present invention described above shows that the conductors are exposed on the front and back surfaces of the laminates 20 and 20A, an insulating resist film may be provided in a region other than the external connection conductors 611, 612, 621, and 622 on the front and back surfaces thereof.

While each of the preferred embodiments of the present invention described above shows that a portion for adjusting impedance is provided using a wiring adjusting conductor, a mounting type inductor may be connected to the wiring adjusting conductor. In addition, the portion to adjust impedance may be a capacitor, or an inductor and a capacitor may be used therefor.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer substrate comprising:
    a laminate including a plurality of dielectric layers laminated in a lamination direction, and a first surface and a second surface perpendicular or substantially perpendicular to the lamination direction;
    a first signal conductor and a second signal conductor disposed at respective positions different in the lamination direction of the laminate;
    a first external connection conductor and a second external connection conductor provided on the first surface;
    a first wiring conductor that connects an end of the first signal conductor to the first external connection conductor;
    a second wiring conductor that connects an end of the second signal conductor to the second external connection conductor;
    the first signal conductor being disposed at a position closer to the first surface than the second signal conductor;
    the first wiring conductor including a wiring adjusting portion having a length corresponding to a difference in distance between the first signal conductor and the second signal conductor in the lamination direction; and
    an intermediate ground conductor for a wiring conductor, provided between the first wiring conductor and the second wiring conductor disposed at an identical position in the lamination direction.

2. The multilayer substrate according to claim 1, wherein the wiring adjusting portion bypasses a placement position of the second wiring conductor in a plane parallel or substantially parallel to the first surface as viewed in the lamination direction.

3. The multilayer substrate according to claim 1, wherein the wiring adjusting portion includes a portion extending from a position where the first signal conductor is disposed toward a position where the second signal conductor is disposed in the lamination direction.

4. The multilayer substrate according to claim 1, further comprising a planar intermediate ground conductor for a signal conductor, disposed between the first signal conductor and the second signal conductor in the lamination direction.

5. The multilayer substrate according to claim 1, wherein the first signal conductor is a linear conductor provided at or substantially at a center of one of the plurality of dielectric layers.

6. The multilayer substrate according to claim 1, further comprising interlayer-connection auxiliary conductors.

7. The multilayer substrate according to claim 1, wherein the wiring adjusting portion surrounds half or substantially half of an area occupied by the interlayer-connection auxiliary conductors.

8. The multilayer substrate according to claim 1, wherein the wiring adjusting portion includes a plurality of conductor patterns.

9. The multilayer substrate according to claim 1, wherein each of the first signal conductor and the second signal conductor is sandwiched by ground conductors in the laminate.

10. The multilayer substrate according to claim 1, wherein a first inductance component of the first wiring conductor is smaller than a second inductance component of the second wiring conductor.

11. The multilayer substrate according to claim 10, wherein a first impedance caused by the first inductance component is smaller than a second impedance caused by the second inductance component.

12. The multilayer substrate according to claim 11, wherein the wiring adjusting portion includes wire adjusting conductors defining an inductor.

13. The multilayer substrate according to claim 12, wherein lengths of the wire adjusting conductors reduce a difference between the first impedance and the second impedance.

14. The multilayer substrate according to claim 1, wherein an impedance of a first transmission line including the first signal conductor and an impedance of a second transmission line including the second signal conductor are same or substantially same.

15. The multilayer substrate according to claim 6, further comprising ground conductors connected to the interlayer-connection auxiliary conductors.

16. A multilayer substrate comprising:
    a laminate including a plurality of dielectric layers laminated in a lamination direction, and a first surface and a second surface perpendicular or substantially perpendicular to the lamination direction;
    a first signal conductor and a second signal conductor disposed at respective positions different in the lamination direction of the laminate;
    a first external connection conductor and a second external connection conductor provided on the first surface;
    a first wiring conductor that connects an end of the first signal conductor to the first external connection conductor; and
    a second wiring conductor that connects an end of the second signal conductor to the second external connection conductor;
    the first signal conductor being disposed at a position closer to the first surface than the second signal conductor;
    the first wiring conductor including a wiring adjusting portion having a length corresponding to a difference in distance between the first signal conductor and the second signal conductor in the lamination direction;
    the wiring adjusting portion including a planar conductor; and
    the planar conductor being narrower than a line width of the first signal conductor.

17. The multilayer substrate according to claim 16, wherein the wiring adjusting portion bypasses a placement position of the second wiring conductor in a plane parallel or substantially parallel to the first surface as viewed in the lamination direction.

18. The multilayer substrate according to claim 16, wherein the wiring adjusting portion includes a portion extending from a position where the first signal conductor is disposed toward a position where the second signal conductor is disposed in the lamination direction.

19. The multilayer substrate according to claim 16, further comprising an intermediate ground conductor for a wiring conductor, provided between the first signal conductor and the second signal conductor disposed at an identical position in the lamination direction.

20. The multilayer substrate according to claim 16, further comprising a planar intermediate ground conductor for a signal conductor, disposed between the first signal conductor and the second signal conductor in the lamination direction.

21. The multilayer substrate according to claim 1, wherein the laminate includes a wiring portion, and a connecting portion wider than the wiring portion; and the wiring adjusting portion is provided in a plane parallel or substantially parallel to the first surface, and is disposed in the connecting portion in the laminate while having a winding shape or a meander shape as viewed in the lamination direction.

* * * * *